US011809807B1

(12) United States Patent
Li et al.

(10) Patent No.: US 11,809,807 B1
(45) Date of Patent: Nov. 7, 2023

(54) METHOD AND DEVICE FOR PROCESSING DATA OVERFLOW IN DECOMPRESSION PROCESS

(71) Applicant: SHANDONG YINGXIN COMPUTER TECHNOLOGIES CO., LTD., Shandong (CN)

(72) Inventors: Shuqing Li, Shandong (CN); Jiang Wang, Shandong (CN); Huajin Sun, Shandong (CN)

(73) Assignee: SHANDONG YINGXIN COMPUTER TECHNOLOGIES CO., LTD., Shandong (CN)

( * ) Notice: Subject to any disclaimer, the term of this patent is extended or adjusted under 35 U.S.C. 154(b) by 0 days.

(21) Appl. No.: 18/039,478

(22) PCT Filed: Jan. 26, 2022

(86) PCT No.: PCT/CN2022/074067
§ 371 (c)(1),
(2) Date: May 30, 2023

(87) PCT Pub. No.: WO2022/174731
PCT Pub. Date: Aug. 25, 2022

(30) Foreign Application Priority Data

Feb. 22, 2021 (CN) .......................... 202110197520.6

(51) Int. Cl.
*H03M 7/00* (2006.01)
*G06F 40/126* (2020.01)
*H03M 7/30* (2006.01)

(52) U.S. Cl.
CPC ........ *G06F 40/126* (2020.01); *H03M 7/6005* (2013.01)

(58) Field of Classification Search
CPC .......................... G06F 40/126; H03M 7/6005
(Continued)

(56) References Cited

U.S. PATENT DOCUMENTS 10,366,026 B1 7/2019 Diamant et al.
10,673,460 B1 6/2020 Kurup et al.
(Continued)

FOREIGN PATENT DOCUMENTS

CN 102841907 A 12/2012
CN 103891150 A 6/2014
(Continued)

*Primary Examiner* — Jean B Jeanglaude
(74) *Attorney, Agent, or Firm* — IPRO, PLLC (57) ABSTRACT

A method for processing data overflow in a decompression process, includes: decompressing an original text, and detecting whether a data overflow event occurs in the decompression process; in response to detecting the data overflow event, storing first data obtained by decompression in a host cache into a target memory, and closing a data read-in port of a decoding engine; decompressing data which is being decompressed in the decoding engine to obtain second data, and storing the second data into a cache of the decoding engine; calculating a position of the decompressed data in the original text; obtaining, on the basis of the position, data which is not decompressed in the original text, re-decompressing the data which is not decompressed to obtain third data, and storing the second data into the target memory; and splicing the first data, the second data, and the third data to obtain complete decompressed data.

20 Claims, 3 Drawing Sheets

(58) Field of Classification Search
USPC .................................................... 341/50, 51
See application file for complete search history.

(56) References Cited

U.S. PATENT DOCUMENTS

| | | | |
|---|---|---|---|
| 10,824,506 B1 | 11/2020 | Avron et al. | |
| 2013/0147644 A1* | 6/2013 | Agarwal | H03M 7/30 341/67 |
| 2016/0087647 A1* | 3/2016 | Fenney | H03M 7/4006 341/67 |
| 2019/0207624 A1* | 7/2019 | Cassetti | H03M 7/3088 |

FOREIGN PATENT DOCUMENTS

| | | |
|---|---|---|
| CN | 104378615 A | 2/2015 |
| CN | 110019184 A | 7/2019 |
| CN | 110943744 A | 3/2020 |
| CN | 112988673 A | 6/2021 |

\* cited by examiner

METHOD AND DEVICE FOR PROCESSING DATA OVERFLOW IN DECOMPRESSION PROCESS

CROSS-REFERENCE TO RELATED APPLICATION

The present application claims the priority of the Chinese patent application filed on Feb. 22, 2021 before the China National Intellectual Property Administration with the application number of 202110197520.6 and the title of "METHOD AND DEVICE FOR PROCESSING DATA OVERFLOW IN DECOMPRESSION PROCESS", which is incorporated herein in its entirety by reference.

FIELD

The present application relates to the field of computers, and more particularly relates to a method and device for processing data overflow in a decompression process.

BACKGROUND

With the rapid development of emerging industries such as big data, generated massive data will grow exponentially, and the massive data will bring a great pressure for existing storage devices. As a traditional computing architecture is replaced with cloud computation, a structure of data storage is also changing. Computing resources and storage resources will be further concentrated to a data center, which further brings a pressure for the storage of a server. When confronted with the increasing massive data, data compression has become one of effective methods for relieving the storage burden and storage cost of the server.

An applicant realizes that for a decompression task, since a compression rate is unknown, it is impossible to accurately open up a cache region for a decompressed file. When an actual compression rate of the file is higher than an expected value, there will be a situation that the decompressed file is larger than the cache region, which is called overflow. When overflow occurs, a traditional approach is to suspend a current task to ensure that a circuit will not continue to output excess data, thereby avoiding leakage of an internal memory. At the same time, the circuit tells a host that overflow occurs to the decompression task, the host discards decompressed data, and then, the host will open up a larger data cache region and resubmit the task to a decompression circuit.

SUMMARY

A first aspect of an embodiment of the present application provides a method for processing data overflow in a decompression process, including the following steps:
decompressing an original text, and detecting whether a data overflow event occurs in the decompression process;
in response to detecting the data overflow event, storing first data obtained by decompression in a host cache into a target memory, and closing a data read-in port of a decoding engine;
decompressing data which is being decompressed in the decoding engine to obtain second data, and storing the second data into a cache of the decoding engine;
calculating a position of the decompressed data in the original text;
obtaining, on the basis of the position, data which is not decompressed in the original text, re-decompressing the data which is not decompressed to obtain third data, and storing the second data into the target memory; and
splicing the first data, the second data, and the third data to obtain complete decompressed data.

According to an embodiment of the present application, the method further includes:
acquiring a production line depth of a current decompression circuit.

According to an embodiment of the present application, the method further includes:
in response to sequentially inputting the data in the original text into the decompression circuit for decompression, storing each of the data inputted into the decompression circuit into a first-in first-out memory at the same time; and
when a quantity of the data stored in the first-in first-out memory is the same as the production line depth, reading a piece of data from the first-in first-out memory and deleting the read data when a piece of data is stored into the first-in first-out memory.

According to an embodiment of the present application, the method further includes:
in response to the quantity of the data stored into the first-in first-out memory being less than the production line depth, closing a read port of the first-in first-out memory until the quantity of the data stored into the first-in first-out memory is the same as the production line depth; and
in response to the quantity of the data stored into the first-in first-out memory being the same as the production line depth, opening the read port of the first-in first-out memory, reading a piece of data from the first-in first-out memory and deleting the read data when a piece of data is stored into the first-in first-out memory.

According to an embodiment of the present application, the method further includes:
in response to sequentially inputting the data in the original text into the decompression circuit for decompression, using a first counter to record the quantity of the data inputted into the decompression circuit.

According to an embodiment of the present application, the calculating a position of the decompressed data in the original text includes:
reading a current reading of the first counter, and acquiring the quantity of the data in the first-in first-out memory;
subtracting the quantity of the data by the reading to obtain the quantity of the decompressed data; and
obtaining the position of the decompressed data in the original text based on the quantity of the data in the original text and the quantity of the decompressed data.

According to an embodiment of the present application, the decompressing an original text, and detecting whether a data overflow event occurs in the decompression process includes:
in response to a data volume outputted from the decoding engine to the host cache being the same as a capacity of the host cache, determining whether there is data which is not decompressed completely; and
in response to there being data which is not decompressed completely, determining that the data overflow event has occurred.

According to an embodiment of the present application, the method further includes:

using a second counter to record a quantity of the second data inputted into the cache of the decoding engine; and obtaining a size of the second data based on a reading of the second counter, and marking the second data.

According to an embodiment of the present application, the storing the second data into the target memory includes:

acquiring the marked data stored in the cache of the decoding engine; and storing the marked data into the target memory.

Another aspect of an embodiment of the present application further provides a device for processing data overflow in a decompression process, where the device includes:

a detecting module, where the detecting module is configured to decompress an original text, and detect whether a data overflow event occurs in the decompression process;

a closing module, where the closing module is configured to, in response to detecting the data overflow event, store first data obtained by decompression in a host cache into a target memory, and close a data read-in port of a decoding engine;

a storage module, where the storage module is configured to decompress data which is being decompressed in the decoding engine to obtain second data, and store the second data into a cache of the decoding engine;

a calculation module, where the calculation module is configured to calculate a position of the decompressed data in the original text;

a decompression module, where the decompression module is configured to obtain, on the basis of the position, data which is not decompressed in the original text, re-decompress the data which is not decompressed to obtain third data, and store the second data into the target memory; and a splicing module, where the splicing module is configured to splice the first data, the second data, and the third data to obtain complete decompressed data.

In some embodiments, the present application further provides a computer device, including a memory and one or more processors, the memory storing a computer-readable instruction which, when executed by the one or more processors, causes the one or more processors to perform the operations of the method for processing data overflow in the decompression process according to any one mentioned above.

In some embodiments, the present application further provides one or more non-volatile computer-readable storage media, storing a computer-readable instruction which, when executed by one or more processors, causes the one or more processors to perform the operations of the method for processing data overflow in the decompression process according to any one mentioned above.

Details of one or more embodiments of the present application will be proposed in the following accompanying drawings and description. Other features and advantages of the present application will become apparent in the following description, accompanying drawings and claims.

BRIEF DESCRIPTION OF THE DRAWINGS

In order to describe the technical solutions in the embodiments of the present application or the prior art more clearly, the accompanying drawings required for describing the embodiments or the prior art will be briefly introduced below. Apparently, the accompanying drawings in the following description show only some embodiments of the present application, and those of ordinary skill in the art may still derive other accompanying drawings from these accompanying drawings without creative efforts.

DETAILED DESCRIPTION

In order to make objectives, technical solutions and advantages of the present application clearer and more understandable, the embodiments of the present application will be further described below in conjunction with specific embodiments and with reference to the accompanying drawings.

Figure 1:
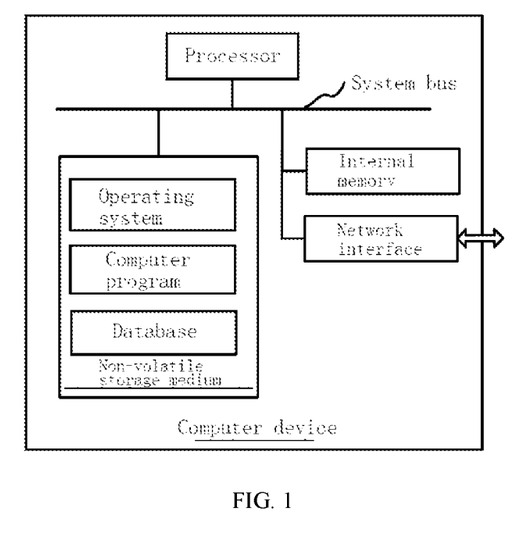
FIG. 1 is a diagram showing an application scenario of a method for processing data overflow in a decompression process according to one or more embodiments of the present application.

A method for processing data overflow in a decompression process in the present application may be applied to a computer device which may be a server, an internal structural diagram thereof may be shown in FIG. 1. The computer device includes a processor, a memory, a network interface and a database which are connected by a system bus. The processor of the computer device is configured to provide calculation and control capacity. The memory of the computer device includes a non-volatile storage medium, and an internal memory. The non-volatile storage medium stores an operating system, a computer program, and a database. The internal memory provides an environment for the operation of the operating system and the computer program in the non-volatile storage medium. The database of the computer device is configured to store data such as operating data of a smart home device. The network interface of the computer device is configured to communicate with an external terminal by network connection. When the computer program is executed by the processor, the method for processing data overflow in the decompression process is implemented. The server may be implemented as an independent server or a server cluster composed of a plurality of servers.

Figure 2:
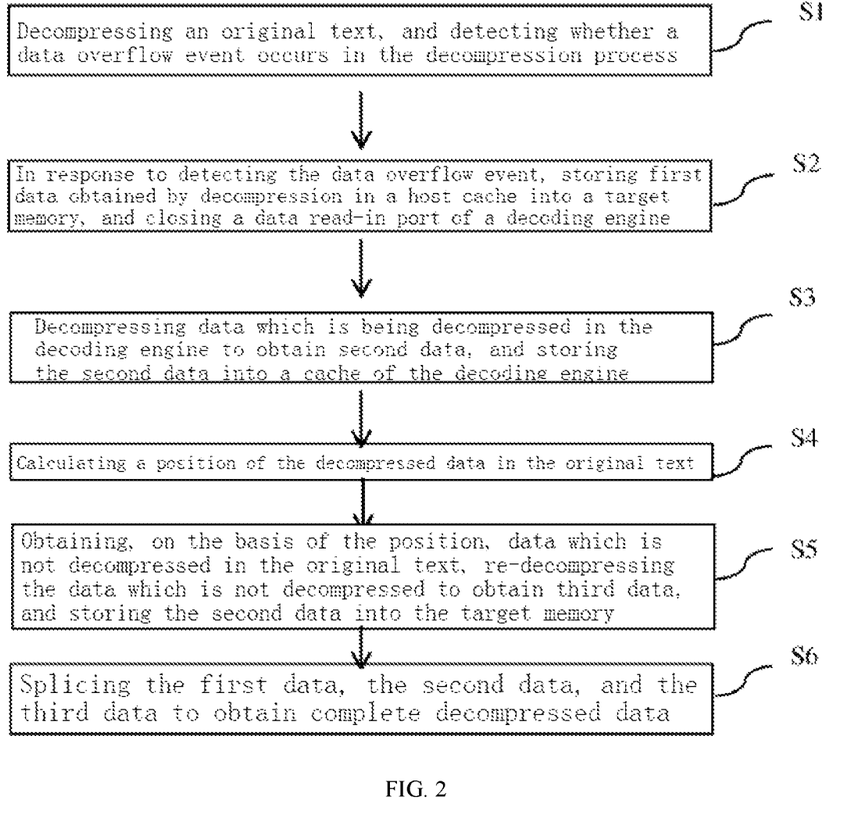
FIG. 2 is a schematic flow chart of a method for processing data overflow in a decompression process according to one or more embodiments of the present application.

Based on the above-mentioned objectives, a first aspect of an embodiment of the present application provides an embodiment of a method for processing data overflow in a decompression process. FIG. 2 shows a schematic flow chart of the method.

As shown in FIG. 2, an example in which the method is applied to the computer device in FIG. 1 is described, and the method may include the following steps:

S1, decompressing an original text, and detecting whether a data overflow event occurs in the decompression process. Decompression is performed according to a process in the prior art, however, when the data obtained after decompression is larger than a host cache in the decompression process, a host has no excess caches to receive new data, and thus, the data overflow event may occur;

S2, in response to detecting the data overflow event, storing first data obtained by decompression in a host cache into a target memory, and closing a data read-in port of a decoding engine. When it is detected that the data overflow event occurs, the host cache stores the data obtained by the decompression, firstly, the part of data is stored into the target memory of the host, at the same time, a data read-in port of a LZ77 decoding engine is closed, and thus, the LZ77 decoding engine is prevented from reading new data;

S3, decompressing data which is being decompressed in the decoding engine to obtain second data, and storing second data into a cache of the decoding engine. When the data overflow event occurs, there is still a certain quantity of data which is being decompressed in the LZ77 decoding engine, it is impossible to store data obtained after the data is decompressed into the host cache, and it is necessary to temporarily store the data into the cache of the LZ77 decoding engine;

S4, calculating a position of the decompressed data in the original text. The quantity of the decompressed data in the original text may be calculated according to the quantity of the decompressed data or data volume, and the decompressed data is stored into the target memory;

S5, obtaining data which is not decompressed in the original text on the basis of the position, re-decompressing the data which is not decompressed to obtain third data, and the second data is stored into the target memory. The data which is not decompressed may be easily calculated on the basis of the position calculated as above, decompression is restarted after all data in the decompression circuit is cleared, and this part of data is re-decompressed, at the same time, the second data stored into the cache of the LZ77 decoding engine is also outputted into the host cache and is stored into the target memory by the host cache; and S6, splicing the first data, the second data and the third data to obtain complete decompressed data. A complete decompressed data file may be obtained after several parts of data are spliced. There are still some situations that the data overflow event occurs again or repeatedly when the data which is not decompressed is re-decompressed. When such a situation occurs, the above method is used for one or more decompression until all the data is decompressed completely, and then, all the data is spliced.

By adopting the technical solution of the present application, repeated decompression may be avoided, the efficiency is improved, the convergence of tasks is ensured, and every time when tasks are submitted, it is certain that a certain quantity of data may be additionally decompressed on the previous basis.

In an embodiment of the present application, the method further includes:

acquiring a production line depth of a current decompression circuit. The production line depth is determined by the decompression circuit, and different depths may be obtained by using different decompression circuits.

In an embodiment of the present application, the method further includes:

in response to sequentially inputting the data in the original text into the decompression circuit for decompression, storing each of the data inputted into the decompression circuit into a first-in first-out memory (FIFO) at the same time; and when a quantity of the data stored in the FIFO is the same as the production line depth, reading a piece of data from the FIFO and deleting the read data when a piece of data is stored into the FIFO.

In some embodiments, the computer device, in response to sequentially inputting the data in the original text into the decompression circuit for decompression, stores each of the data inputted into the decompression circuit into an FIFO at the same time; determines whether the quantity of the data stored in the FIFO is the same as the production line depth; and in response to the quantity of the data stored into the FIFO being the same as the production line depth, reads a piece of data from the FIFO and deletes the read data when a piece of data is stored into the FIFO.

Figure 4:
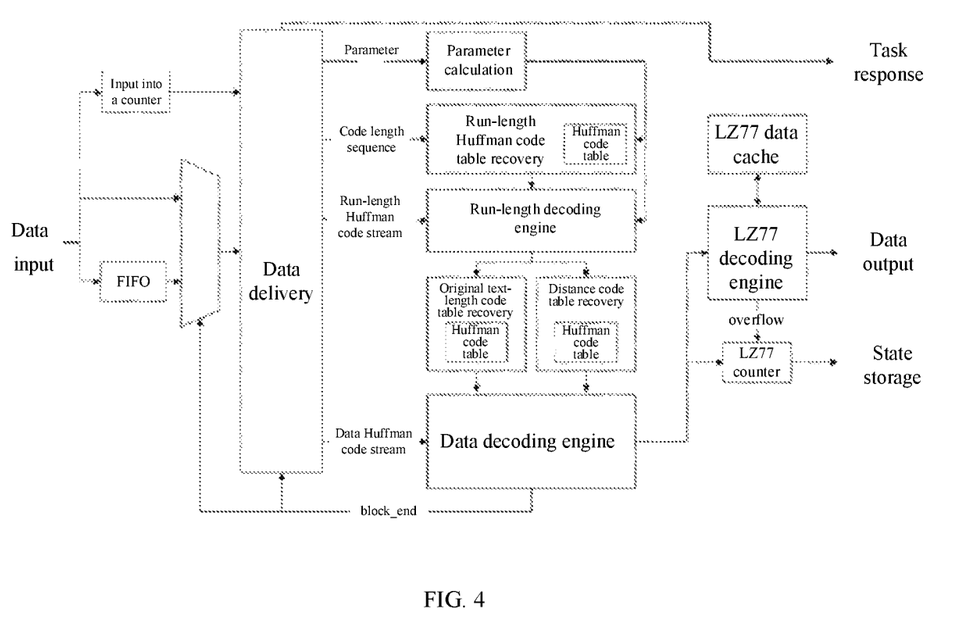
FIG. 4 is a schematic diagram of a decompression circuit according to one or more embodiments of the present application.

In an embodiment of the present application, the method further includes:

in response to the quantity of the data stored into the FIFO being less than the production line depth, closing a read port of the FIFO is closed until the quantity of the data stored into the FIFO is the same as the production line depth; and in response to the quantity of the data stored into the FIFO being the same as the production line depth, opening the read port of the FIFO, reading a piece of data from the FIFO and deleting the read data when a piece of data is stored into the FIFO. As shown in FIG. 4, a FIFO is added on a data input port of the decompression circuit, and when a decompression engine needs to newly read a piece of data, the data may be delivered to the FIFO at the same time. Moreover, the quantity of the data in the FIFO is controlled to be the same as the production line depth of the decompression circuit (which does not include the LZ77 decoding engine), that is, when the quantity of the data in the FIFO is less than the production line depth, the read port of the FIFO is closed, and the data is only written into the FIFO. After the data in the FIFO is equal to the production line depth, the read port is opened, and it is ensured that a piece of data is read from the read port and the read data is deleted when a piece of data is written into the FIFO.

In an embodiment of the present application, the method further includes:

in response to sequentially inputting the data in the original text into the decompression circuit for decompression, using a first counter to record the quantity of the data inputted into the decompression circuit. A data input end in the decompression circuit is additionally provided with a counter which is configured to record a position of currently consumed data to be decompressed, that is, the reading of the counter is automatically increased by one when the circuit acquires a piece of data from the input port.

In an embodiment of the present application, the calculating a position of the decompressed data in the original text includes:

reading a current reading of the first counter, and acquiring the quantity of the data in the FIFO;

subtracting the quantity of the data by the reading to obtain the quantity of the decompressed data; and obtaining the position of the decompressed data in the original text based on the quantity of the data in the original text and the quantity of the decompressed data. When the data overflow event occurs, the decompression circuit stops acquiring new data, at the same time, the counter is stopped, a current reading value is read from the counter, then, the quantity of remaining elements is read from the FIFO, the two values are subtracted to obtain the position of the original text, and the position is used as a position of a consumed original text to be decompressed and is reported to the host.

In an embodiment of the present application, the decompressing an original text, and it is detected whether a data overflow event occurs in the decompression process includes:

in response to a data volume outputted from the decoding engine to the host cache being the same as a capacity of the host cache, determining whether there is data which is not decompressed completely; and in response to there being data which is not decompressed completely, determining that the data overflow event has occurred.

In the decompression process, when it is detected by the LZ77 decoding engine that the total data volume outputted currently is equal to the size of the host cache, and at the moment, the LZ77 decoding engine does not complete the decompression of all the data, the engine reports the data overflow event.

In an embodiment of the present application, the method further includes:

using a second counter to record the quantity of the second data inputted into the cache of the decoding engine; and obtaining a size of the second data based on a reading of the second counter, and the second data is marked.

In an embodiment of the present application, the step that the second data is stored into the target memory includes:

acquiring the marked data stored in the cache of the decoding engine; and storing the marked data into the target memory. When the data overflow event occurs, the input port of the LZ77 decoding engine is closed, that is, the LZ77 decoding engine does not receive new input data any more. At the same time, an output port of the LZ77 decoding engine to the host cache is closed because there is no excess space in the host cache to receive new data at the moment. Remaining data on a production line inside the LZ77 decoding engine is further decompressed, and the decompressed data is written into the cache of the LZ77 decoding engine. A counter circuit is added on an output end of the LZ77 decoding engine; in a normal working process, the counter is reset; and when the data overflow event occurs, the reading of the counter is automatically increased by one when a piece of new data is written into the cache of the LZ77 decoding engine. Added is a state field which is called a size of data which is not outputted. After all the data on the production line of the LZ77 decoding engine is processed completely, a value of the counter is written into the state field; and when the task is ended, the field will be stored into a host end together with other state fields.

After the data overflow event reported by the decompression circuit is detected by the host, firstly, the host copies all decompressed data from the current data cache to the target memory, and then, the host acquires the position of the original text consumed by the current task from a task response, and marks data in front of the position as the decompressed data. After the host completes tail-in work of the current task, a part of data which is not decompressed in the current task alone or together with data which is not decompressed in the next task is used as a new decompression task to be delivered to the decompression circuit; and after the circuit receives a new task, firstly, data is acquired from a circuit state cache, and a circuit state is reset (a restoring process and method belong to the implementation of a stateful decompression circuit, which is not discussed in the present application), the circuit needs to acquire, from the state data, the size of the data which is not outputted, data of which the volume is equal to the value needs to be outputted to the host cache in a process that the cache of the LZ77 decoding engine is reset, and the data outputted to the host is located at the tail of the data cache. For example, when the size of the data which is not outputted is 100 bytes, the size of the cache of the LZ77 decoding engine is 2000 bytes, when the cache of the LZ77 decoding engine is reset, the first 1900 bytes are only written into the cache of the LZ77 decoding engine, but are not outputted to the host, and the last 100 bytes are written into both of the cache of the LZ77 decoding engine and the host.

In an embodiment of the present application, a data selector circuit is added on the input end of the decompression circuit, and the circuit selects one path of data to be delivered to the decompression circuit from the input port and the output of the FIFO. Under a normal condition, the input data is delivered to the data decoding engine; and when the data decoding engine detects an end-of-block symbol, the input port of the engine will be closed, the data which is not decompressed in the production line of the current decompression circuit is cleared, and then, a data selector is controlled to read data from the output port of the FIFO and reconstruct a production line.

The present application has the following beneficial technical effects that: by using the technical solution of the method for processing data overflow in the decompression process in the embodiment of the present application, in which an original text is decompressed, and it is detected whether a data overflow event occurs in the decompression process;

in response to detecting the data overflow event, first data obtained by decompression in a host cache is stored into a target memory, and a data read-in port of a decoding engine is closed; data which is being decompressed in the decoding engine is decompressed to obtain second data, and the second data is stored into a cache of the decoding engine; a position of the decompressed data in the original text is calculated; data which is not decompressed in the original text is obtained on the basis of the position, the data which is not decompressed is re-decompressed to obtain third data, and the second data is stored into the target memory; and the first data, the second data, and the third data are spliced to obtain complete decompressed data. Therefore, repeated decompression may be avoided, the efficiency is improved, the convergence of tasks is ensured, and every time when tasks are submitted, and a certain quantity of data may be additionally decompressed on the previous basis.

By using the technical solution of the present application, repeated decompression may be avoided, the efficiency is improved, the convergence of tasks is ensured, and every time when tasks are submitted, and a certain quantity of data may be additionally decompressed on the previous basis.

It should be noted that it may be understood by people skilled in the art that all or parts of flows of the method in the above-mentioned embodiments may be completed by a computer program by which relevant hardware is instructed. The above-mentioned program may be stored in a computer-readable storage medium. When the program is executed, the flows in each of the above-mentioned embodiments of the method may be included. The storage medium may be a diskette, a compact disc, a read-only memory (ROM) or a random access memory (RAM), and the like. The above-mentioned embodiment of the computer program may achieve the same or similar effects as any embodiment of the corresponding foregoing method.

In addition, the method disclosed according to the embodiments of the present application may also be implemented as a computer program executed by a CPU, and the computer program may be stored in a computer-readable storage medium. When the computer program is executed by the CPU, the above-mentioned functions limited in the method disclosed in the embodiments of the present application are performed.

Figure 3:
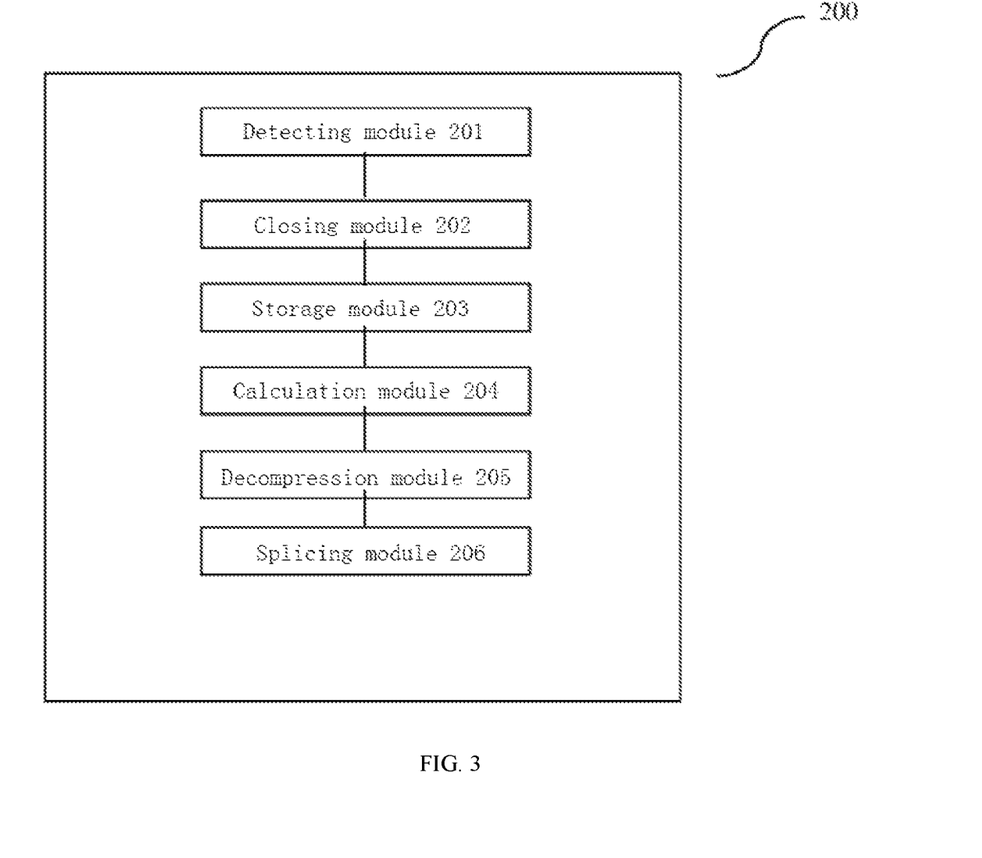
FIG. 3 is a schematic diagram of a device for processing data overflow in a decompression process according to one or more embodiments of the present application.

Based on the above-mentioned objectives, a second aspect of an embodiment of the present application provides a device for processing data overflow in a decompression process, as shown in FIG. 3, the device 200 includes:
- a detecting module, where the detecting module is configured to decompress an original text, and detect whether a data overflow event occurs in the decompression process;
- a closing module, where the closing module is configured to, in response to detecting the data overflow event, store first data obtained by decompression in a host cache into a target memory, and close a data read-in port of a decoding engine;
- a storage module, where the storage module is configured to decompress data which is being decompressed in the decoding engine to obtain second data, and store the second data into a cache of the decoding engine;
- a calculation module, where the calculation module is configured to calculate a position of the decompressed data in the original text;
- a decompression module, where the decompression module is configured to obtain, on the basis of the position, data which is not decompressed in the original text, re-decompress the data which is not decompressed to obtain third data, and store the second data into the target memory; and
- a splicing module, where the splicing module is configured to splice the first data, the second data, and the third data to obtain complete decompressed data.

According to another aspect of the present application, a computer device is provided. The computer device includes a memory and one or more processors, the memory, having stored thereon, a computer-readable instruction which, when executed by the one or more processors, causes the one or more processors to perform the operations of the method in any one of the embodiments.

An embodiment of the present description further provides one or more non-volatile computer-readable storage media, having stored thereon, a computer-readable instruction which, when executed by one or more processors, causes the one or more processors to perform the operations of the method in any one of the embodiments.

It may be understood by the skill in the art that the structure shown in FIG. 1 is only a block diagram of parts of structures relevant to the solution of the present application, and does not constitute a limitation on the device to which the solution of the present application is applied. In some embodiments, the device may include more or fewer components than those shown in the figure, or a combination of some components, or components disposed differently.

It may be understood by those of ordinary skill in the art that all or parts of flows of the method in the above-mentioned embodiments may be completed by a computer-readable instruction by which relevant hardware is instructed. The computer-readable instruction is stored in a non-volatile computer-readable storage medium. Any reference to a memory, storage, a database or other media used in each embodiment provided in the present application may include a non-volatile and/or a volatile memory. The non-volatile memory may include a read-only memory (ROM), a programmable ROM (PROM), an electrically-programmable ROM (EPROM), an electrically erasable programmable ROM (EEPROM) or a flash memory. The volatile memory may include a random access memory (RAM) or an external high-speed cache memory. As an illustration rather than a limitation, the RAM is available in various forms, such as a static RAM (SRAM), a dynamic RAM (DRAM), a synchronous DRAM (SDRAM), a dual data rate SDRAM (DDRSDRAM), an enhanced SDRAM (ESDRAM), a synchlink DRAM (SLDRAM), a rambus direct RAM (RDRAM), a direct memory bus dynamic RAM (DRDRAM), and a memory bus dynamic RAM (RDRAM).

All the technical features in the above-mentioned embodiments may be combined arbitrarily. For simplifying the description, possible combinations of the technical features in the above-mentioned embodiments are not all described. However, the combinations of these technical features shall fall within the scope recorded in the present description as long as they are no conflicts therein.

The above-mentioned embodiments only express several implementations of the present application, are described relatively specifically and in more detail, but should not be understood as limitations on the scope of the present application. It should be indicated that those of ordinary skill in the art may further make several variations and improvements without departing from the concept of the present application, and these variations and improvements shall fall within the protection scope of the present application. Therefore, the protection scope of the present application should be subject to the appended claims.

The invention claimed is:

1. A method for processing data overflow in a decompression process, comprising:
   - decompressing an original text, and detecting whether a data overflow event occurs in the decompression process;
   - in response to detecting the data overflow event, storing first data obtained by decompression in a host cache into a target memory, and closing a data read-in port of a decoding engine;
   - decompressing data which is being decompressed in the decoding engine to obtain second data, and storing the second data into a cache of the decoding engine;
   - calculating a position of the decompressed data in the original text;
   - obtaining, on the basis of the position, data which is not decompressed in the original text, re-decompressing the data which is not decompressed to obtain third data, and storing the second data and the third data into the target memory; and
   - splicing the first data, the second data, and the third data to obtain complete decompressed data.

2. The method according to claim 1, further comprising: acquiring a production line depth of a current decompression circuit.

3. The method according to claim 2, further comprising:
   - in response to sequentially inputting the data in the original text into the decompression circuit for decompression, storing each of the data inputted into the decompression circuit into a first-in first-out memory at the same time;
   - determining whether a quantity of the data stored in the first-in first-out memory is the same as the production line depth; and
   - when the quantity of the data stored in the first-in first-out memory is the same as the production line depth, reading a piece of data from the first-in first-out memory and deleting the read data when a piece of data is stored into the first-in first-out memory.

4. The method according to claim 3, further comprising:
in response to the quantity of the data stored into the first-in first-out memory being less than the production line depth, closing a read port of the first-in first-out memory until the quantity of the data stored into the first-in first-out memory is the same as the production line depth; and
in response to the quantity of the data stored into the first-in first-out memory being the same as the production line depth, opening the read port of the first-in first-out memory, reading a piece of data from the first-in first-out memory and deleting the read data when a piece of data is stored into the first-in first-out memory.

5. The method according to claim 4, further comprising:
in response to sequentially inputting the data in the original text into the decompression circuit for decompression, using a first counter to record the quantity of the data inputted into the decompression circuit.

6. The method according to claim 5, wherein the calculating a position of the decompressed data in the original text comprises:
reading a current reading of the first counter, and acquiring the quantity of the data in the first-in first-out memory;
subtracting the quantity of the data by the reading to obtain the quantity of the decompressed data; and
obtaining the position of the decompressed data in the original text based on the quantity of the data in the original text and the quantity of the decompressed data.

7. The method according to claim 5, wherein the using a first counter to record the quantity of the data inputted into the decompression circuit comprises:
increasing the reading of the counter by one when the decompression circuit acquires a piece of data from an input port.

8. The method according to claim 1, wherein the decompressing an original text, and detecting whether a data overflow event occurs in the decompression process comprises:
in response to a data volume outputted from the decoding engine to the host cache being the same as a capacity of the host cache, determining whether there is data which is not decompressed completely; and
in response to there being data which is not decompressed completely, determining that the data overflow event has occurred.

9. The method according to claim 1, further comprising:
using a second counter to record a quantity of the second data inputted into the cache of the decoding engine; and
obtaining a size of the second data based on a reading of the second counter, and marking the second data.

10. The method according to claim 9, wherein the storing the second data and the third data into the target memory comprises:
acquiring the marked data stored in the cache of the decoding engine; and
storing the marked data into the target memory.

11. The method according to claim 1, wherein the obtaining, on the basis of the position, data which is not decompressed in the original text, re-decompressing the data which is not decompressed comprises:
obtaining the data which is not decompressed in the original text on the basis of the position;
restarting decompression after all data in the decompression circuit is cleared; and
re-decompressing the data which is not decompressed.

12. The method according to claim 1, further comprising:
in response to the data overflow event occurring again or repeatedly when the data which is not decompressed is re-decompressed, performing one or more decompression until all the data is decompressed completely.

13. A device for processing data overflow in a decompression process, wherein the device comprises:
a detecting module, wherein the detecting module is configured to decompress an original text, and detect whether a data overflow event occurs in the decompression process;
a closing module, wherein the closing module is configured to, in response to detecting the data overflow event, store first data obtained by decompression in a host cache into a target memory, and close a data read-in port of a decoding engine;
a storage module, wherein the storage module is configured to decompress data which is being decompressed in the decoding engine to obtain second data, and store the second data into a cache of the decoding engine;
a calculation module, wherein the calculation module is configured to calculate a position of the decompressed data in the original text;
a decompression module, wherein the decompression module is configured to obtain, on the basis of the position, data which is not decompressed in the original text, re-decompress the data which is not decompressed to obtain third data, and store the second data and the third data into the target memory; and
a splicing module, wherein the splicing module is configured to splice the first data, the second data, and the third data to obtain complete decompressed data.

14. The device according to claim 13, wherein the device further comprises:
a first acquiring module, wherein the first acquiring module is configured to acquire a production line depth of a current decompression circuit.

15. The device according to claim 14, wherein the device further comprises:
a first storage module, wherein the first storage module is configured to, in response to sequentially inputting the data in the original text into the decompression circuit for decompression, store each of the data inputted into the decompression circuit into a first-in first-out memory at the same time; and
a reading module, wherein the reading module is configured to, when a quantity of the data stored in the first-in first-out memory is the same as the production line depth, read a piece of data from the first-in first-out memory and delete the read data when a piece of data is stored into the first-in first-out memory.

16. The device according to claim 15, wherein the device further comprises:
a first closing module, wherein the first closing module is configured to, in response to the quantity of the data stored into the first-in first-out memory being less than the production line depth, close a read port of the first-in first-out memory until the quantity of the data stored into the first-in first-out memory is the same as the production line depth; and
an opening module, wherein the opening module is configured to, in response to the quantity of the data stored into the first-in first-out memory being the same as the production line depth, open the read port of the first-in first-out memory, read a piece of data from the first-in first-out memory and delete the read data when a piece of data is stored into the first-in first-out memory.

17. The device according to claim 16, wherein the device further comprises:
a first record module, wherein the first record module is configured to, in response to sequentially inputting the data in the original text into the decompression circuit for decompression, use a first counter to record the quantity of the data inputted into the decompression circuit.

18. The device according to claim 17, wherein the calculation module is further configured to:
read a current reading of the first counter, and acquire the quantity of the data in the first-in first-out memory;
subtract the quantity of the data by the reading to obtain the quantity of the decompressed data; and
obtain the position of the decompressed data in the original text based on the quantity of the data in the original text and the quantity of the decompressed data.

19. The device according to claim 13, wherein the detecting module is further configured to:
in response to a data volume outputted from the decoding engine to the host cache being the same as a capacity of the host cache, determine whether there is data which is not decompressed completely; and
in response to there being data which is not decompressed completely, determine that the data overflow event has occurred.

20. The device according to claim 13, wherein the device further comprises:
a second record module, wherein the second record module is configured to use a second counter to record a quantity of the second data inputted into the cache of the decoding engine; and
a second acquiring module, wherein the second acquiring module is configured to acquire a size of the second data based on a reading of the second counter, and mark the second data.

* * * * *